United States Patent
Gong et al.

(10) Patent No.: US 8,585,161 B2
(45) Date of Patent: Nov. 19, 2013

(54) ENCLOSURE HAVING COLLAPSIBLE HANDLE

(75) Inventors: Xin-Hu Gong, Shenzhen (CN); Ju-Wen Dai, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 149 days.

(21) Appl. No.: 13/309,578

(22) Filed: Dec. 2, 2011

(65) Prior Publication Data
US 2012/0248952 A1    Oct. 4, 2012

(51) Int. Cl.
*A47B 81/00*    (2006.01)

(52) U.S. Cl.
USPC ...................................... 312/223.2

(58) Field of Classification Search
USPC .................. 312/223.2; 361/679.58, 679.6
See application file for complete search history.

(56) References Cited

U.S. PATENT DOCUMENTS

| | | | |
|---|---|---|---|
| 6,762,934 B2 * | 7/2004 | Kitchen et al. | 361/679.58 |
| 7,168,772 B1 * | 1/2007 | Liang | 292/336.3 |
| 7,864,522 B1 * | 1/2011 | Peng et al. | 361/679.33 |
| 7,920,384 B2 * | 4/2011 | Westphall et al. | 361/727 |
| 8,045,326 B1 * | 10/2011 | Reznikov | 361/679.38 |
| 8,118,271 B2 * | 2/2012 | Peng et al. | 248/222.11 |
| 8,243,435 B2 * | 8/2012 | Li | 361/679.37 |
| 8,297,574 B2 * | 10/2012 | Zhang et al. | 248/221.11 |
| 8,416,563 B2 * | 4/2013 | Hou | 361/679.33 |
| 2006/0067063 A1 * | 3/2006 | Stahl et al. | 361/754 |
| 2008/0239657 A1 * | 10/2008 | Oyama et al. | 361/685 |
| 2009/0103258 A1 * | 4/2009 | Signer et al. | 361/679.33 |
| 2009/0279249 A1 * | 11/2009 | Crippen et al. | 361/679.58 |

* cited by examiner

*Primary Examiner* — Hanh V Tran
(74) *Attorney, Agent, or Firm* — Altis & Wispro Law Group, Inc.

(57) ABSTRACT

An exemplary enclosure includes a housing, a box slidably inserted into the housing, and a pair of handles pivotably attached on the box. The housing includes ports and the box includes plugs which can be inserted into the ports, respectively. The handle includes a main body pivotably attached to the box and an operating member slidably connected to the main body. The handle can be rotated around the box to engage with a locking post of the housing to drive the plugs to be inserted into the ports. The operating member can be pulled from the main body to increase a total length of the handle. The operating member can also be pushed into the main body to reduce the total length of the handle.

17 Claims, 10 Drawing Sheets

ENCLOSURE HAVING COLLAPSIBLE HANDLE

BACKGROUND

1. Technical Field

The present disclosure relates to enclosures for electronic equipment, and particularly, to an enclosure having one or more handles.

2. Description of Related Art

Servers are commonly used to store and process data. A typical server includes an enclosure and a plurality of electronic elements, such as hard disk drives and CPUs (central processing units), mounted within the enclosure. In order to facilitate maintenance, repair and replacement of the electronic components in the enclosure, the enclosure is designed to be a modular structure. Typically, the enclosure includes a fixed housing and a movable box mounted to the housing. The box is received in the housing in normal operation of the server and the electronic components thereof. The box can be pulled out of the housing if maintenance, repair or replacement of any of the electronic components is required.

The box typically has a plurality of electrical plugs for connection with electrical ports defined in the housing so that the box can be electrically and physically connected to the housing. For facilitating insertion of the plugs into the ports, a handle is pivotably attached on the box. A positioning structure such as a post is formed on the housing corresponding to the handle. The handle can be brought to engage with the post of the housing and then rotated around an axis of the post. The mutual action between the handle and the post drives the box to move towards the housing, thereby pushing the plugs into the ports.

However, when the box has a large number of plugs, friction force between the plugs and the ports is correspondingly large. The handle may be difficult to maneuver or even ineffectual in driving the plugs into the ports, since a large force is required to be applied on the handle in order to overcome the friction force.

What is needed, therefore, is an enclosure having one or more handles which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
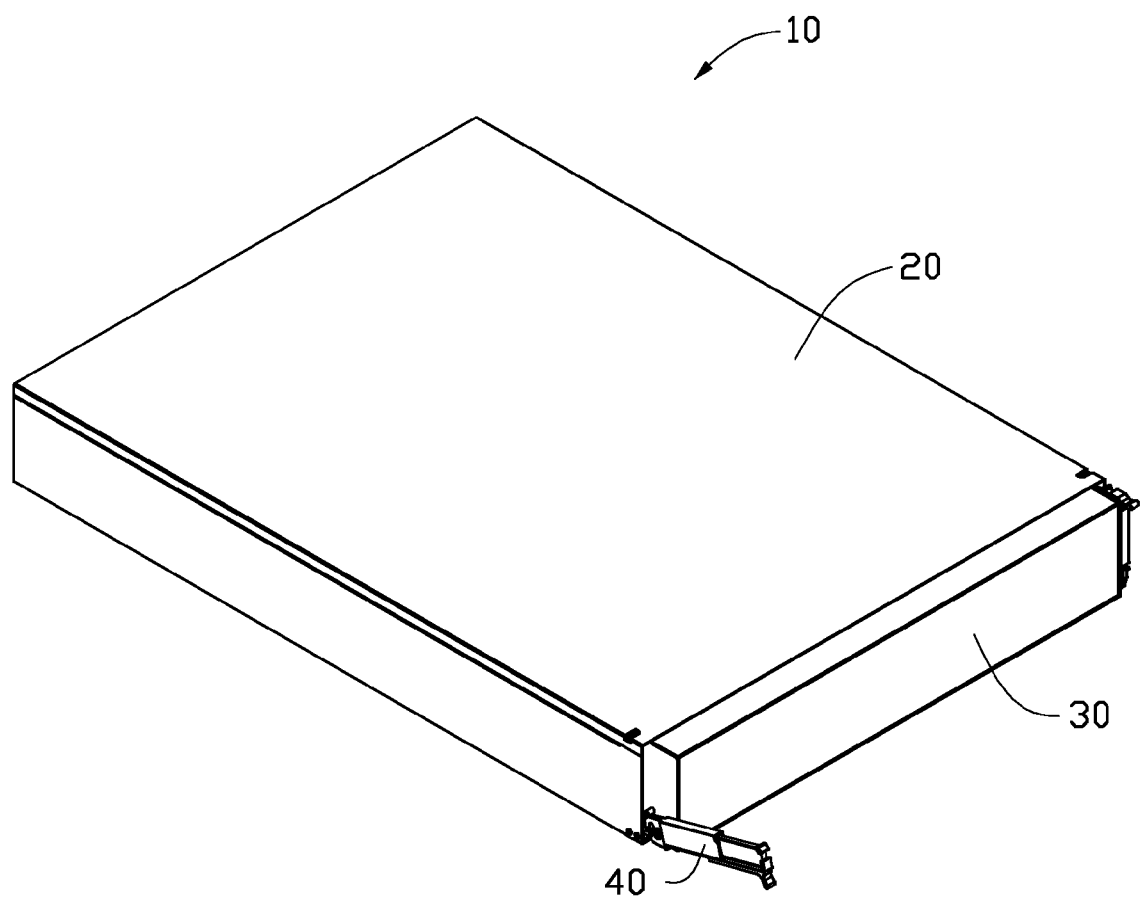
FIG. 1 is an isometric, assembled view of an enclosure in accordance with an embodiment of the present disclosure.

Referring to FIG. 1, an enclosure 10 in accordance with an embodiment of the present disclosure is shown. The enclosure 10 includes a housing 20, a box 30 removably mountable in the housing 20, and a pair of handles 40 pivotably attached to the box 30.

Figure 2:
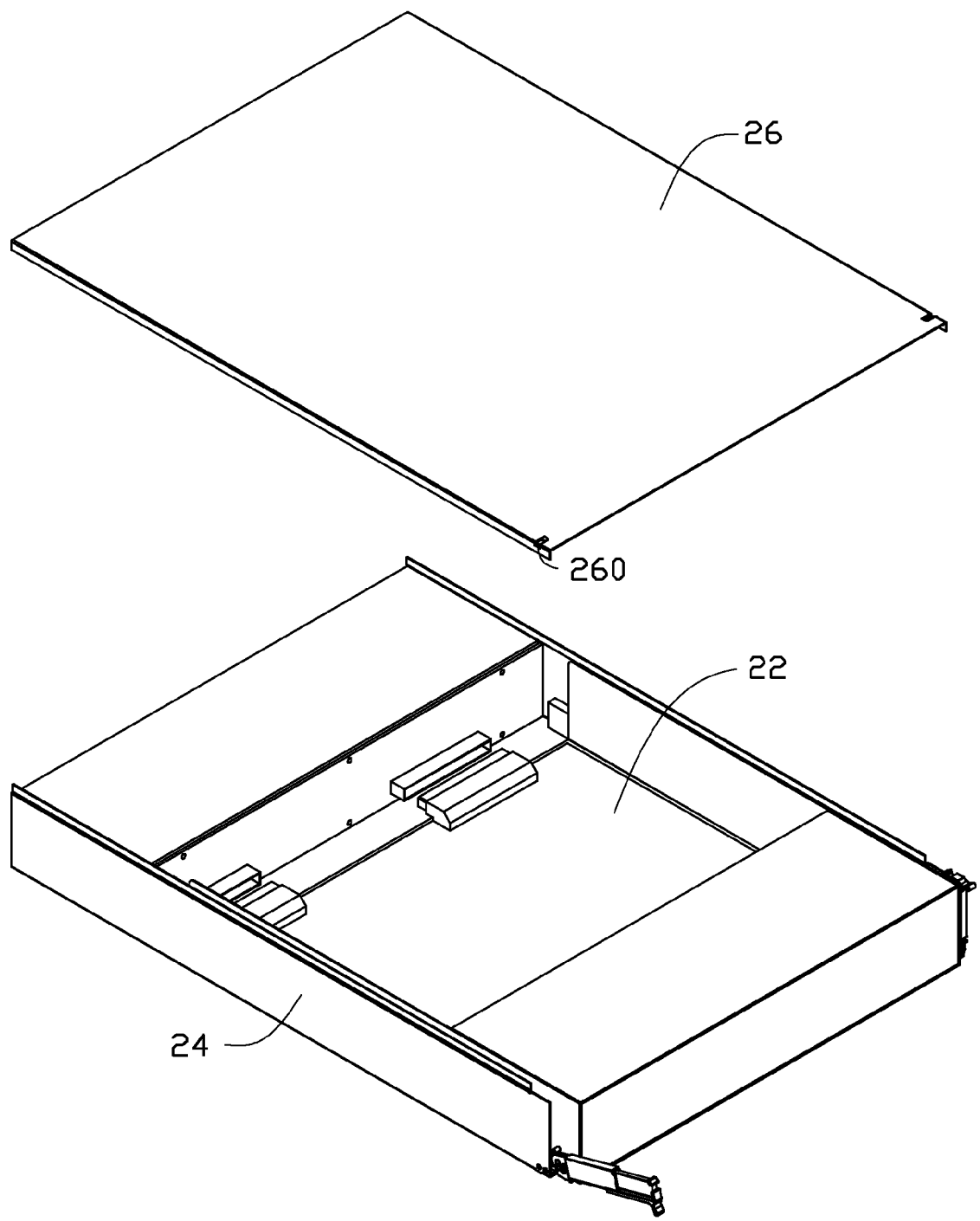
FIG. 2 is an exploded view of the enclosure of FIG. 1.
Figure 3:
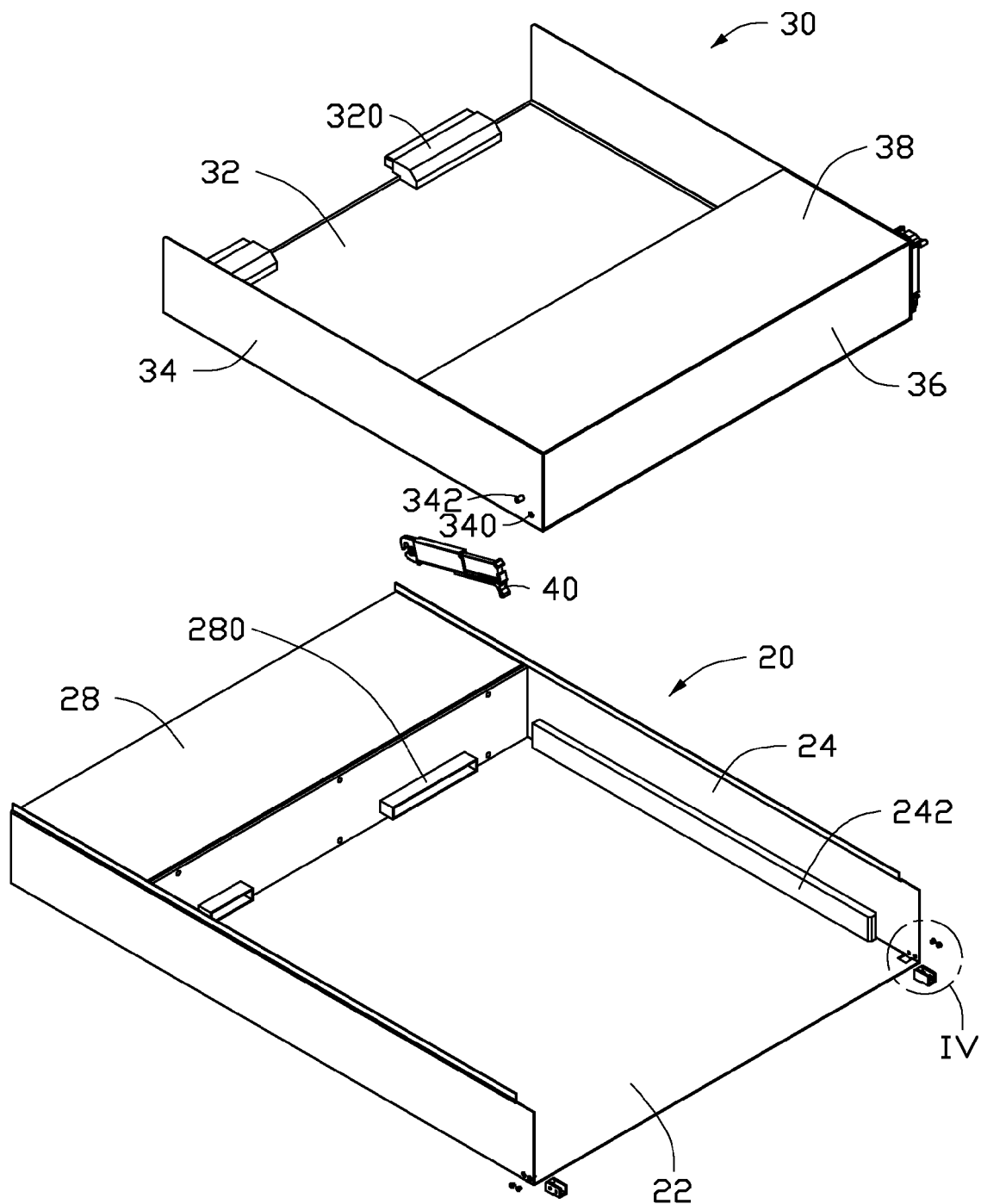
FIG. 3 is a further exploded view of the enclosure of FIG. 2.
Figure 4:
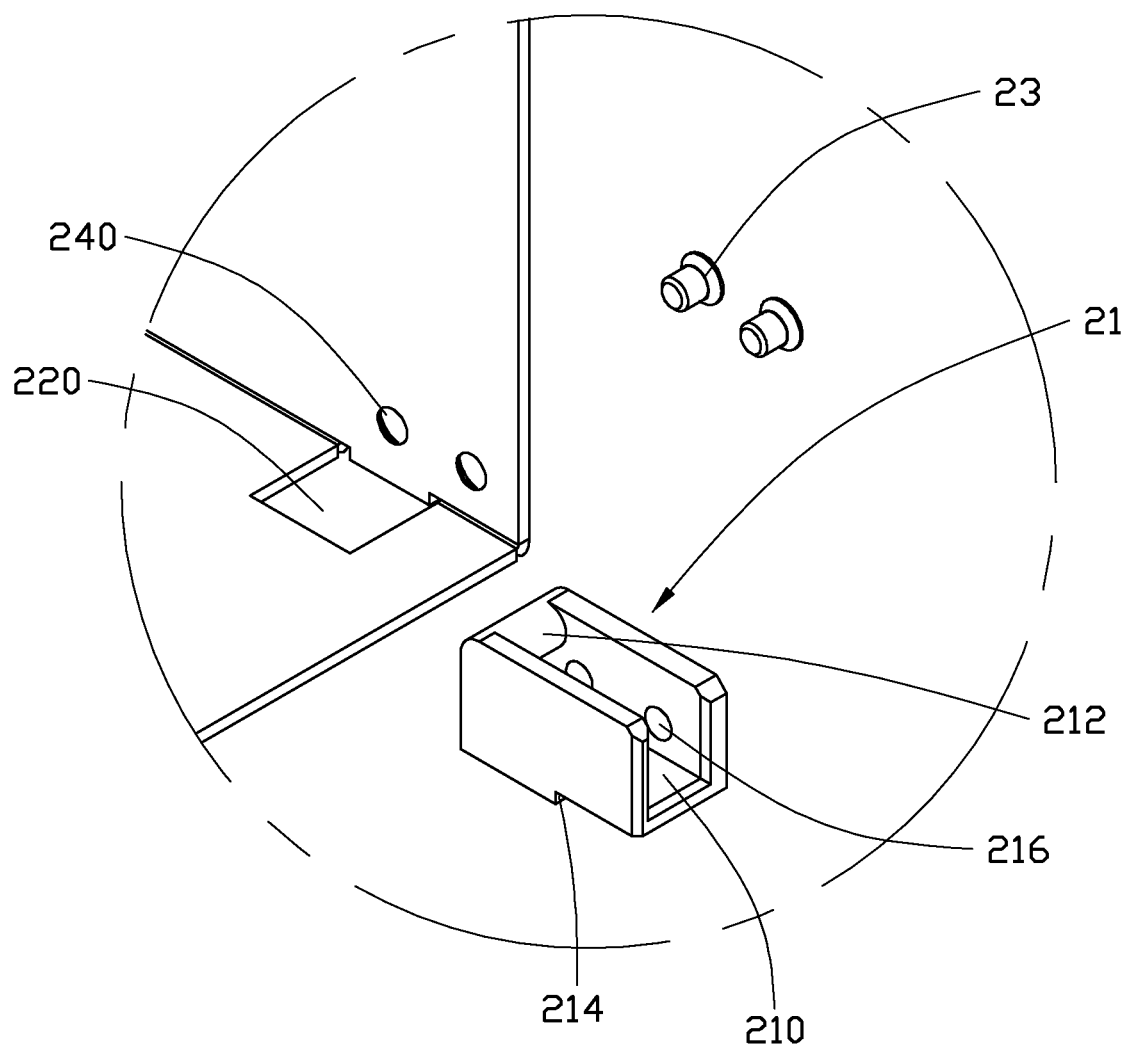
FIG. 4 is an enlarged view of a circled part IV of the enclosure of FIG. 3.

Also referring to FIGS. 2-4, the housing 20 is a hollow casing including a bottom panel 22, a pair of sidewalls 24 extending upwardly and perpendicularly from two opposite lateral sides of the bottom panel 22, a container 28 fixed on the bottom panel 22 and located between the sidewalls 24, and a top panel 26 secured on the sidewalls 24. The bottom panel 22 has two rectangular holes 220 defined at the two opposite lateral sides thereof, respectively. A pair of strips 242 are fixed to inner faces of the two sidewalls 24, respectively. The two strips 242 are also connected to a top face of the bottom panel 22. The two strips 242 are used to guide the box 30 to slide into and out from the housing 20. Each sidewall 24 defines two circular holes 240 adjacent to the rectangular hole 220 thereof. The container 28 is located behind the two strips 242. The container 28 has a plurality of electronic components (not shown) received therein, and a pair of electrical ports 280 electrically connected to the electronic components. In alternative embodiments, the ports 280 can be optoelectrical ports, optoelectronic ports, etc. The ports 280 are exposed on a front side of the container 280 for connecting with the box 30. The top panel 26 has an area identical to that of the bottom panel 22. The top panel 26 forms a pair of tabs 260 (also shown in FIGS. 7-10), corresponding to the rectangular holes 220, respectively. The tabs 260 are elastically deformable to lock with the handles 40.

A pair of brackets 21 are fixed to the bottom panel 22. Each bracket 21 includes a U-shaped shell 210, a protrusion 214 protruding downwardly from a bottom face of the shell 210, and a locking post 212 horizontally formed within the shell 210. The shell 210 has a bottom portion, and a pair of side portions extending upwardly from two opposite sides of the bottom portion. The protrusion 214 of each bracket 21 is fittingly received in a corresponding rectangular hole 220 of the bottom panel 22 to position each bracket 21 to the bottom panel 22. The locking post 212 is connected between corners of the two side portions, and is located above and spaced a distance from the bottom portion of the shell 210 of the bracket 21. An outer one of the side portions of the shell 210 has two through holes 216 defined therein. The two through holes 216 of each bracket 21 are aligned with the two through holes 240 of the corresponding sidewall 24, so that two screws 23 can extend through the through holes 240, 216 to fix the bracket 21 to the sidewall 24.

The box 30 includes a bottom plate 32, a pair of side plates 34 and a front plate 36 extending upwardly and perpendicularly from two opposite lateral sides and a front side of the bottom plate 32, respectively, and a top plate 38 fixed to the side plates 34 and the front plate 36. Two electrical plugs 320 are formed on a rear side of the bottom plate 32, for connection with the ports 280 of the housing 20, respectively. In alternative embodiments, the plugs 320 can be optoelectrical plugs, optoelectronic plugs, etc. A plurality of electronic components (not shown) are received in a space enclosed by the top plate 38, the front plate 36 and the two side plates 34. The electronic components are electrically connected to the two plugs 320. The top plate 38 has an area smaller than that of the bottom plate 32. Each side plate 34 has a positioning post 342 protruding outwardly and horizontally therefrom, and a through hole 340 adjacent to the positioning post 342. The positioning post 342 and the through hole 340 are located adjacent to a front corner of the side plate 34.

Figure 5:
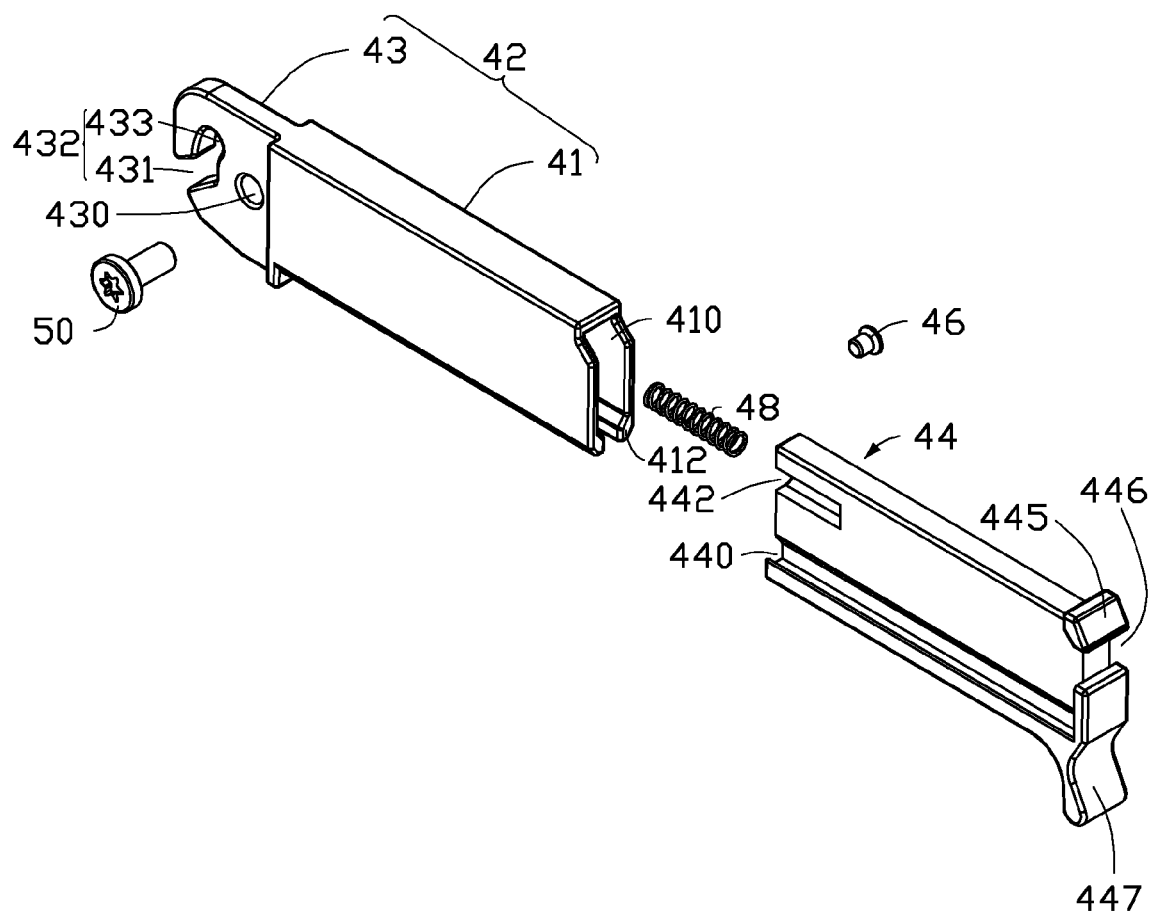
FIG. 5 is an enlarged, exploded view of a handle of the enclosure of FIG. 3.
Figure 6:
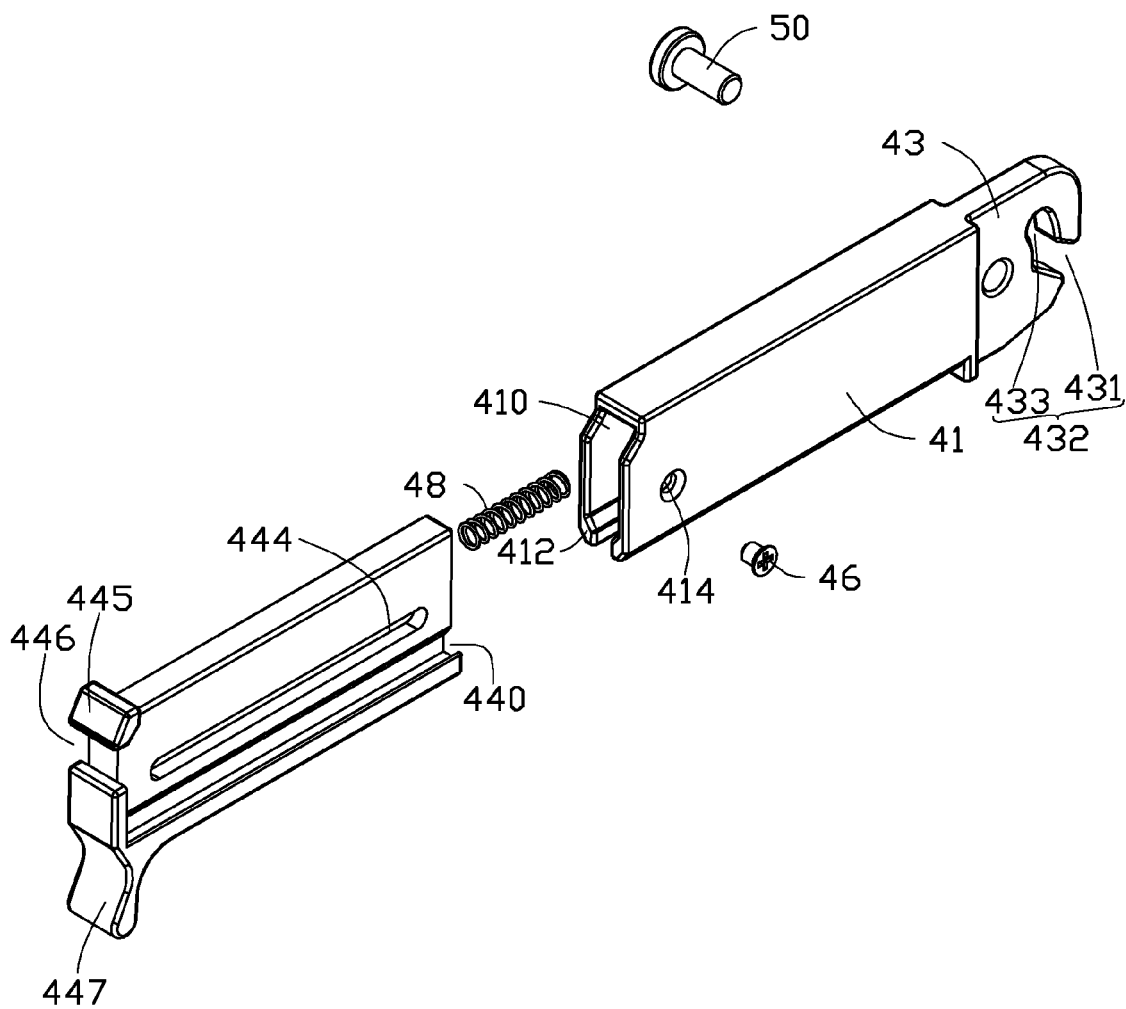
FIG. 6 shows the handle of FIG. 5 from another aspect.

The pair of handles 40 have the same configuration. Therefore only one of the handles 40 will be described in detail below for brevity. Also referring to FIGS. 5-6, the handle 40 includes a main body 42, and an operating member 44 slidably insertable into the main body 42. The main body 42 includes a receiving member 41, and a pivoting member 43 connected to the receiving member 41. The receiving member 41 is hollow and forms a chamber 410 therein. The chamber 410 is open to the outside at a front end of the receiving member 41, for allowing the operating member 44 to enter the receiving member 41. The chamber 410 is also open to the outside at a bottom side of the receiving member 41, for allowing the operating member 44 to be slidingly inserted into the receiving member 41. In particular, a pair of rails 412 are formed in the chamber 410 at bottoms of opposite lateral inner sides of the receiving member 41 where the chamber 410 communicates with the outside. The rails 412 protrude towards and are spaced from each other. A hole 414 is defined in one of the lateral sides of the receiving member 41, for extending a screw 46 into the chamber 410.

The pivoting member 43 is connected to a rear end of the receiving member 41. The pivoting member 43 has a curved profile. The pivoting member 43 defines a groove 432 extending from the rear end into an interior of the pivoting member 43. The groove 432 can receive the locking post 212 of the bracket 21 therein. The groove 432 includes a straight section 431 at the rear end, and a curved section 433 in the interior of the pivoting member 43 and communicating with the straight section 431. The pivoting member 43 also defines a through hole 430 adjacent to the receiving member 41. The through hole 430 of the pivoting member 43 is aligned with the through hole 340 of the corresponding side plate 34 of the box 30. A screw 50 extends through the through holes 430, 340 to act as a rotation axle for rotation of the pivoting member 43 about the box 30. The rotation axle (i.e., the screw 50) defines a rotation axis. A distance between the straight section 431 of the groove 432 and the axis gradually decreases from an end of the straight section 431 adjacent to the rear end of the pivoting member 43 towards an opposite end of the straight section 431 communicating with the curved section 433 of the groove 432. A distance between the curved section 433 of the groove 432 and the axis is constant.

The operating member 44 is slidably inserted into the chamber 410 of the receiving member 41 when required. The operating member 44 defines a pair of channels 440 in two opposite lateral sides thereof. The rails 412 are slidably retained within the channels 440, respectively, whereby the operating member 44 can slide within the chamber 410 along the rails 412. The operating member 44 further defines a first slot 442 in one of the two opposite lateral sides thereof. The first slot 442 extends from a rear end of the operating member 44 to an interior of the operating member 44. A spring 48 is partially fixed in the first slot 442 of the operating member 44. When the operating member 44 is inserted into the receiving member 41, the spring 48 is elastically compressed between the operating member 44 and the receiving member 41, thereby producing a resilient force pushing the operating member 44 forward (as viewed in FIGS. 5-6). A second slot 444 is defined in the other opposite lateral side of the operating member 44. The screw 46 extending into the chamber 410 of the receiving member 41 has a terminal retained within the second slot 444. Thereby, the screw 46 prevents the operating member 44 from being completely slid out from the receiving member 41. The first slot 442, the second slot 444, and the channels 440 are parallel to each other. A block 445 and a tongue 447 are formed on a front end of the operating member 44. The tongue 447 is configured for being gripped by an operator to thereby drive the operating member 44 to rotate. A gap 446 is defined between the tongue 447 and the block 445. The gap 446 is used to receive a corresponding tab 260 of the top panel 46 therein, to lock the handle 40 with the housing 20 (see FIG. 10).

Figure 7:
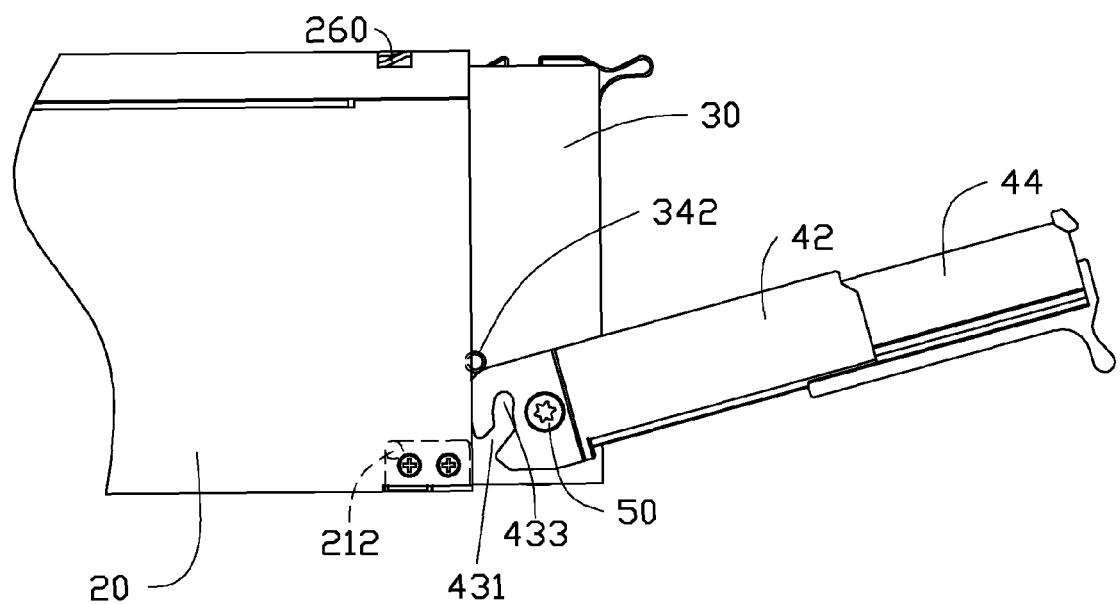
FIG. 7 is an enlarged, side plan view of part of the enclosure of FIG. 1, wherein the handle is in an open status ready to rotate about a box of the enclosure.
Figure 8:
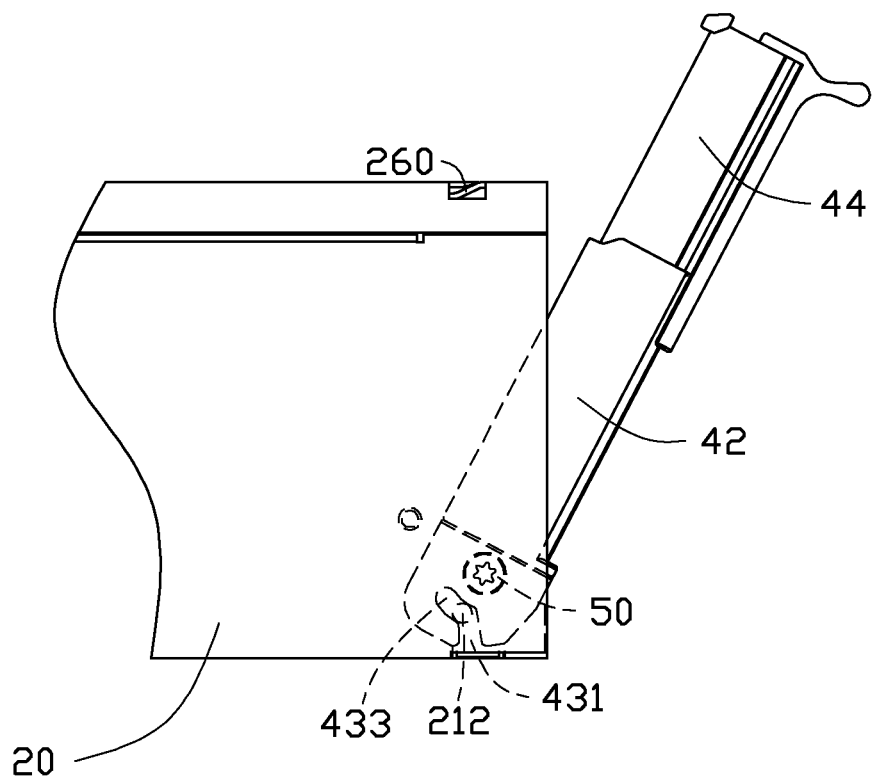
FIG. 8 is similar to FIG. 7, but showing the box fully received in a housing of the enclosure, and the handle rotated to engage with a post of the housing.

Also referring to FIGS. 7-10, in assembly, each handle 40 is pivotably attached to the box 30 beforehand, wherein the receiving member 41 of the handle 40 is pressed by and located below the positioning post 342 of the box 20 in a nearly horizontal orientation, as shown in FIG. 7. The operating member 44 is pulled from the receiving member 41 to increase a total length of the handle 40. The screw 46 abuts against an end of the second slot 444 of the operating member 44 to prevent the operating member 44 from being pulled completely out from the receiving member 41. The box 30 is received in the housing 20 and pushed towards a rear of the housing 20 until the plugs 320 are located close to the ports 280. The handle 40 is then rotated up so that the locking post 212 of the bracket 21 enters the straight section 431 of the groove 432 and slides up within the straight section 431 of the groove 432. During the movement of the locking post 212 along the straight section 431 of the groove 432, the locking post 212 rides along one edge of the straight section 431 of the groove 432 and thereby drives the box 30 to move further inside the housing 20. When the locking post 212 has reached a junction of the straight section 431 and the curved section 433, as shown in FIG. 8, the box 30 has been driven to be substantially fully received in the housing 20, with the plugs 320 being fully inserted into the ports 280.

Figure 9:
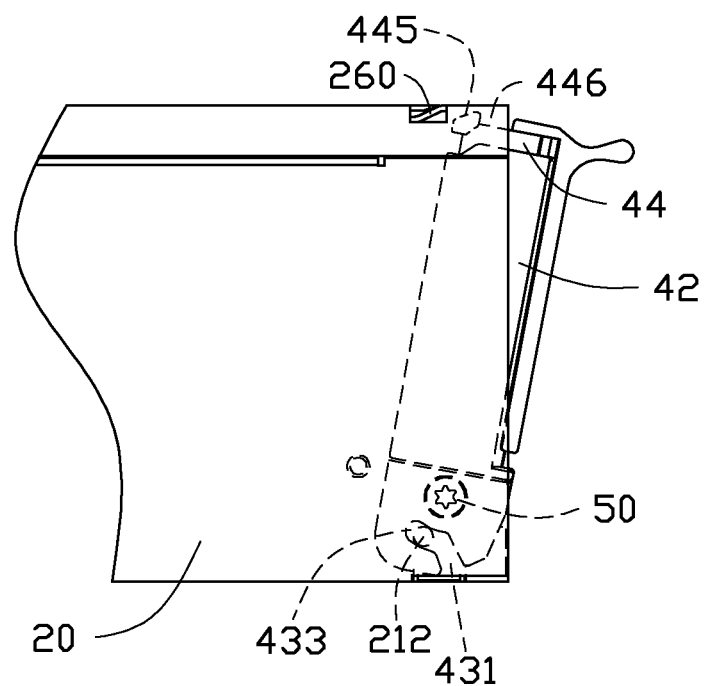
FIG. 9 is similar to FIG. 8, but showing the handle collapsed and further rotated to be mostly received in the housing.
Figure 10:
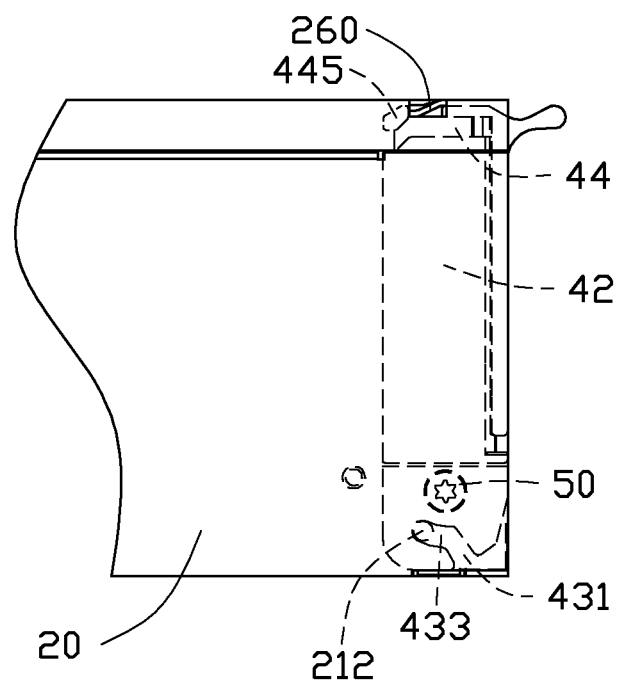
FIG. 10 is similar to FIG. 9, but showing the handle further rotated to a closed status to secure the box in the housing.

Then the operating member 44 is slid into the receiving member 41 to decrease the total length of the handle 40. The shortened handle 40 is further rotated about the axis to make the locking post 212 of the bracket 21 slide within the curved section 433 of the groove 432, as shown in FIG. 9. When the locking post 212 of the bracket 21 has reached an inmost end of the curved section 433 of the groove 432, the tab 260 of the top panel 26 is retained within the gap 446 of the operating member 44 to lock the housing 20 with the handle 40, as shown in FIG. 10. The assembly of the box 30 into the housing 20 is thus completed.

Since the operating member 44 can be extended out of the receiving member 41 to increase the total length of the handle 40, the handle 40 can be easily operated even when the operator applies a small driving force on the handle 40. Therefore, the assembly of the box 30 into the housing 20 is labor-saving and convenient.

It is believed that the present disclosure will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:
1. An enclosure comprising:
a housing comprising a port and a locking post;

a box slidably mounted in the housing, the box comprising a plug; and a handle comprising:

a main body pivotably attached to the box, the main body being pivotable about the box to engage with the locking post and thereby drive the box into the housing such that the plug of the box is aligned with and inserted into the port of the housing; and an operating member slidably connected to the main body, the operating member being slidable relative to the main body between an extended position in which a total length of the handle is increased and a retracted position in which the total length of the handle is reduced;

wherein the main body of the handle comprises a receiving member connected to the operating member and a pivoting member pivotably attached on the box by an axle;

wherein the operating member is inserted into the receiving member in the retracted position and pulled from the receiving member in the extended position;

wherein the receiving member defines a chamber therein to receive the operating member, the chamber having an end open towards the operating member; and wherein the receiving member comprises a pair of rails formed from two opposite lateral inner faces of the chamber, the operating member defines a pair of channels in two opposite lateral outer sides thereof, and the channels slidably receive the rails.

2. The enclosure of claim 1, wherein the pivoting member defines a groove extending from a periphery to an interior thereof, the locking post being received in the groove.

3. The enclosure of claim 2, wherein the groove has a straight section and a curved section communicating with the straight section, the straight section being open to the exterior of the pivoting member at the periphery of the pivoting member, and the curved section terminating at an inmost end of the groove in the interior of the pivoting member.

4. The enclosure of claim 3, wherein the axle defines a pivot axis, a distance between the straight section of the groove and the axis gradually decreases from an end of the straight section where the straight section is open to the exterior to an opposite end of the straight section where the straight section communicates with the curved section, and a distance between the curved section of the groove and the axis is constant.

5. The enclosure of claim 1, wherein the handle further comprises a spring sandwiched between the operating member and the receiving member, the spring being compressed when the operating member is in the retracted position.

6. The enclosure of claim 5, wherein the operating member further defines a first slot in an end thereof adjacent to the main body, the first slot receiving the spring.

7. The enclosure of claim 6, wherein the operating member further defines a second slot in one of the two opposite lateral outer sides thereof, the handle further comprising a screw extending through a side of the receiving member into the second slot of the operating member.

8. The enclosure of claim 7, wherein the screw is slidable along the second slot, the screw abutting against an end of the second slot to prevent the operating member from being completely slid out from the receiving member when the operating member is in the extended position.

9. The enclosure of claim 7, wherein the first slot, the second slot and the channels are parallel to each other.

10. The enclosure of claim 1, wherein the operating member defines a gap in an end thereof away from the main body, the housing comprising a tab received in the gap of the operating member when the operating member is in the retracted position.

11. The enclosure of claim 10, wherein the housing further comprises a bottom panel, a pair of sidewalls extending upwardly from the bottom panel, a top panel fixed to the sidewalls, and a container mounted on the bottom panel, the port being formed on the container.

12. The enclosure of claim 11, wherein the tab is formed on the top panel.

13. The enclosure of claim 11, wherein the housing further comprises a bracket fixed on the bottom panel thereof, the bracket comprising a shell and a protrusion protruding downwardly from the shell, the locking post being a part of the bracket and connected to the shell.

14. The enclosure of claim 13, wherein the protrusion is inserted into the bottom panel, and the locking post is located within the shell and spaced a distance above the bottom panel.

15. The enclosure of claim 1, wherein the box comprises a bottom plate and a pair of side plates extending upwardly from the bottom plate, the axis extending through the pivoting member into one of the side plates, and the plug being formed on the bottom plate.

16. The enclosure of claim 15, wherein the one of the side plates has a positioning post formed thereon, the positioning post abutting against the main body of the handle before the main body is pivoted about the box.

17. An enclosure comprising:

a housing comprising a port and a locking post;

a box slidably mounted in the housing, the box comprising a plug; and a handle comprising:

a main body pivotably attached to the box, the main body being pivotable about the box to engage with the locking post and thereby drive the box into the housing such that the plug of the box is aligned with and inserted into the port of the housing; and an operating member slidably connected to the main body, the operating member being slidable relative to the main body between an extended position in which a total length of the handle is increased and a retracted position in which the total length of the handle is reduced;

wherein the main body of the handle comprises a receiving member connected to the operating member and a pivoting member pivotably attached on the box by an axle;

wherein the operating member defines a gap in an end thereof away from the main body, the housing comprising a tab received in the gap of the operating member when the operating member is in the retracted position;

wherein the housing further comprises a bottom panel, a pair of sidewalls extending upwardly from the bottom panel, a top panel fixed to the sidewalls, and a container mounted on the bottom panel, the port being formed on the container; and wherein the housing further comprises a bracket fixed on the bottom panel thereof, the bracket comprising a shell and a protrusion protruding downwardly from the shell, the locking post being a part of the bracket and connected to the shell.

* * * * *